US012588542B2

(12) United States Patent
Molina et al.

(10) Patent No.: US 12,588,542 B2
(45) Date of Patent: Mar. 24, 2026

(54) MULTI-TOOL AND MULTI-DIRECTIONAL PACKAGE SINGULATION

(71) Applicant: TEXAS INSTRUMENTS INCORPORATED, Dallas, TX (US)

(72) Inventors: John Carlo C. Molina, Limay (PH); Connie A. Esteron, Mabalacat (PH); Ruby Ann M. Camenforte, Pampanga (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 527 days.

(21) Appl. No.: 18/090,317

(22) Filed: Dec. 28, 2022

(65) Prior Publication Data

US 2024/0222144 A1      Jul. 4, 2024

(51) Int. Cl.
| | |
|---|---|
| *H01L 21/56* | (2006.01) |
| *H01L 21/683* | (2006.01) |
| *H01L 23/00* | (2006.01) |
| *H01L 23/31* | (2006.01) |
| *H01L 25/16* | (2023.01) |

(52) U.S. Cl.
CPC ........ *H01L 21/561* (2013.01); *H01L 21/6836* (2013.01); *H01L 23/3107* (2013.01); *H01L 24/48* (2013.01); *H01L 24/49* (2013.01); *H01L 24/97* (2013.01); *H01L 25/16* (2013.01); *H01L 2224/16245* (2013.01); *H01L 2224/48175* (2013.01); *H01L 2224/48465* (2013.01); *H01L 2224/49176* (2013.01); *H01L 2224/97* (2013.01)

(58) Field of Classification Search
None
See application file for complete search history.

(56) References Cited

U.S. PATENT DOCUMENTS

| | | | |
|---|---|---|---|
| 2005/0116321 A1* | 6/2005 | Li | H01L 23/49548 257/666 |
| 2011/0278703 A1* | 11/2011 | Pagaila | H01L 24/19 257/659 |
| 2020/0185234 A1* | 6/2020 | Ancheta | H01L 23/49503 |
| 2020/0411419 A1* | 12/2020 | Hatori | H01L 23/49582 |

* cited by examiner

*Primary Examiner* — Jay C Chang
(74) *Attorney, Agent, or Firm* — Dawn Jos; Frank D. Cimino

(57) ABSTRACT

In some examples, a method for manufacturing a semiconductor package comprises coupling first and second semiconductor dies to a metal frame; covering the first and second semiconductor dies and the metal frame with a mold compound; coupling first and second passive components to the first and second semiconductor dies, the first and second passive components on an external surface of the mold compound; sawing through a portion of the metal frame from a first direction to form a first vertical surface of the metal frame, the first vertical surface having a first roughness due to the sawing; and laser cutting through the mold compound and a remainder of the metal frame from a second direction opposing the first direction to form a second vertical surface on the metal frame and a third vertical surface on the mold compound, the second vertical surface having a second roughness due to the laser cutting and the third vertical surface having a third roughness due to the laser cutting.

14 Claims, 14 Drawing Sheets

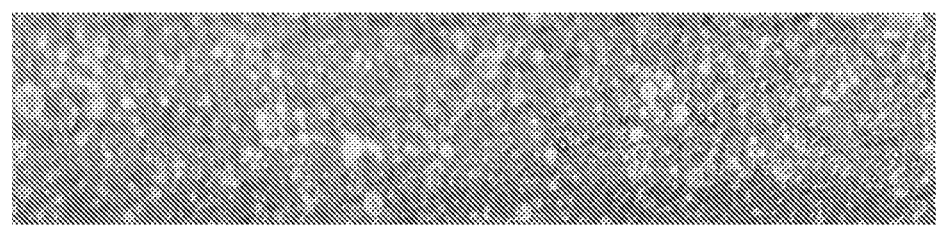
FIG. 1B
140
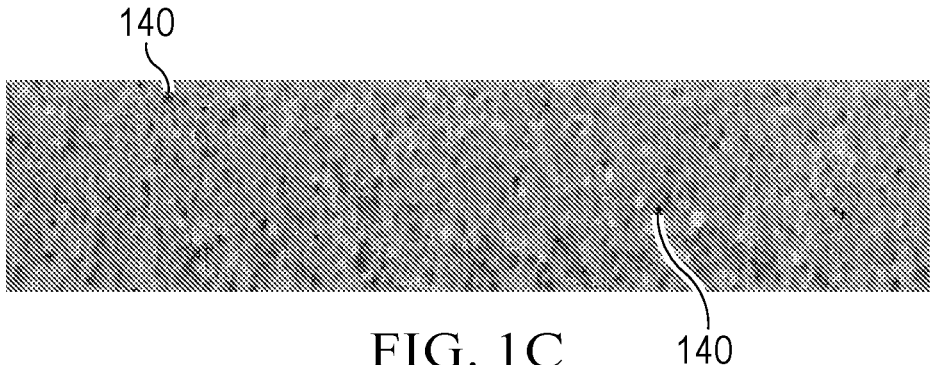
FIG. 1C     140

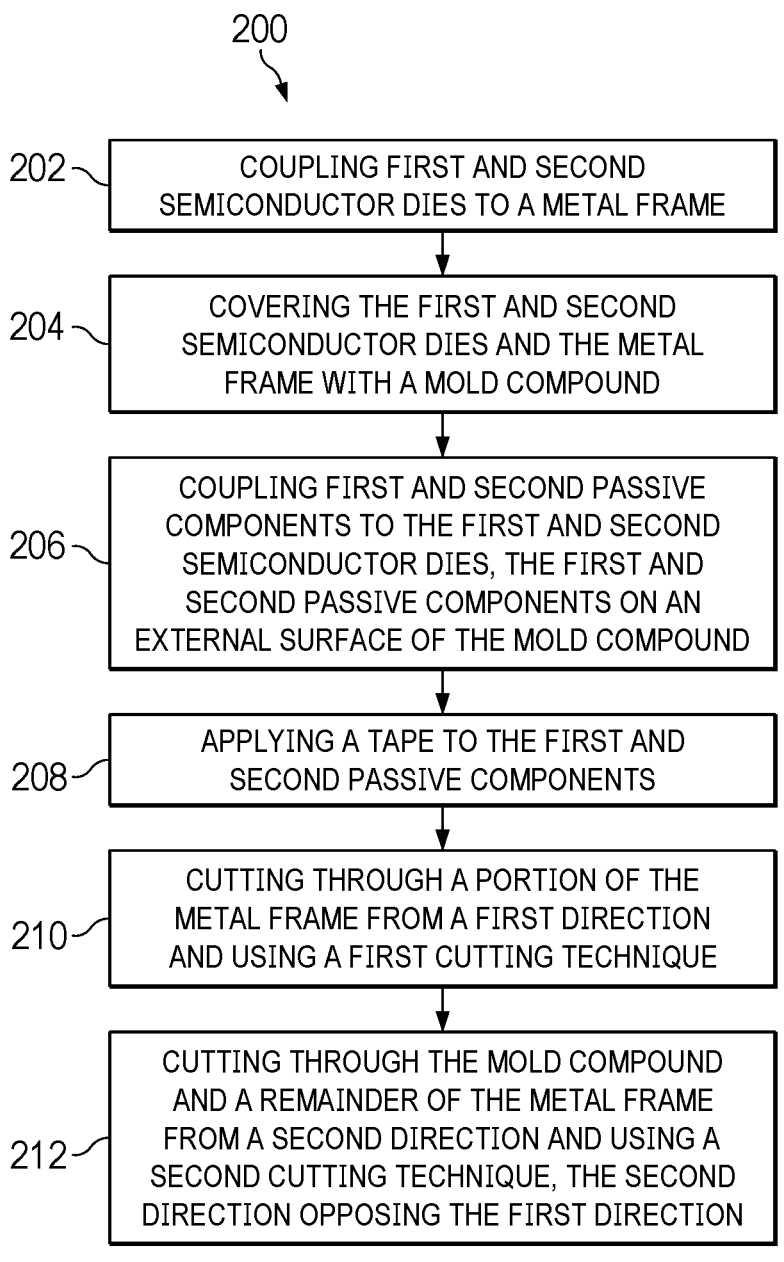

200

202 — COUPLING FIRST AND SECOND SEMICONDUCTOR DIES TO A METAL FRAME

204 — COVERING THE FIRST AND SECOND SEMICONDUCTOR DIES AND THE METAL FRAME WITH A MOLD COMPOUND

206 — COUPLING FIRST AND SECOND PASSIVE COMPONENTS TO THE FIRST AND SECOND SEMICONDUCTOR DIES, THE FIRST AND SECOND PASSIVE COMPONENTS ON AN EXTERNAL SURFACE OF THE MOLD COMPOUND

208 — APPLYING A TAPE TO THE FIRST AND SECOND PASSIVE COMPONENTS

210 — CUTTING THROUGH A PORTION OF THE METAL FRAME FROM A FIRST DIRECTION AND USING A FIRST CUTTING TECHNIQUE

212 — CUTTING THROUGH THE MOLD COMPOUND AND A REMAINDER OF THE METAL FRAME FROM A SECOND DIRECTION AND USING A SECOND CUTTING TECHNIQUE, THE SECOND DIRECTION OPPOSING THE FIRST DIRECTION

FIG. 2

MULTI-TOOL AND MULTI-DIRECTIONAL PACKAGE SINGULATION

BACKGROUND

During semiconductor chip manufacturing, circuits may be formed on a semiconductor wafer (or more simply "wafer"). The wafer may be separated (or "singulated") into a plurality of semiconductor dies, each die having a circuit formed thereon. Each die is then coupled to a die pad and is coupled (e.g., via bond wires) to conductive terminals. A mold compound is applied to cover the die, the die pad, the bond wires, and the conductive terminals, thus forming a semiconductor package. The semiconductor package may be integrated in an electronic device (e.g., computers, smartphones).

SUMMARY

In some examples, a method for manufacturing a semiconductor package comprises coupling first and second semiconductor dies to a metal frame; covering the first and second semiconductor dies and the metal frame with a mold compound; coupling first and second passive components to the first and second semiconductor dies, the first and second passive components on an external surface of the mold compound; sawing through a portion of the metal frame from a first direction to form a first vertical surface of the metal frame, the first vertical surface having a first roughness due to the sawing; and laser cutting through the mold compound and a remainder of the metal frame from a second direction opposing the first direction to form a second vertical surface on the metal frame and a third vertical surface on the mold compound, the second vertical surface having a second roughness due to the laser cutting and the third vertical surface having a third roughness due to the laser cutting.

In examples, a semiconductor package comprises a metal structure including first and second vertical surfaces having first and second roughnesses, respectively; a semiconductor die coupled to the metal structure; a mold compound covering the metal structure and the semiconductor die, the mold compound having a third vertical surface, the third vertical surface having a third roughness; and a passive component on an external surface of the mold compound and coupled to the semiconductor die.

BRIEF DESCRIPTION OF THE DRAWINGS

FIGS. 1B and 1C illustrate different roughness patterns achieved by blade saw and laser cuts, respectively.

FIG. 2 is a flow diagram of a method for manufacturing a semiconductor package using the singulation technique described herein, in accordance with various examples.

DETAILED DESCRIPTION

Figure 1A:
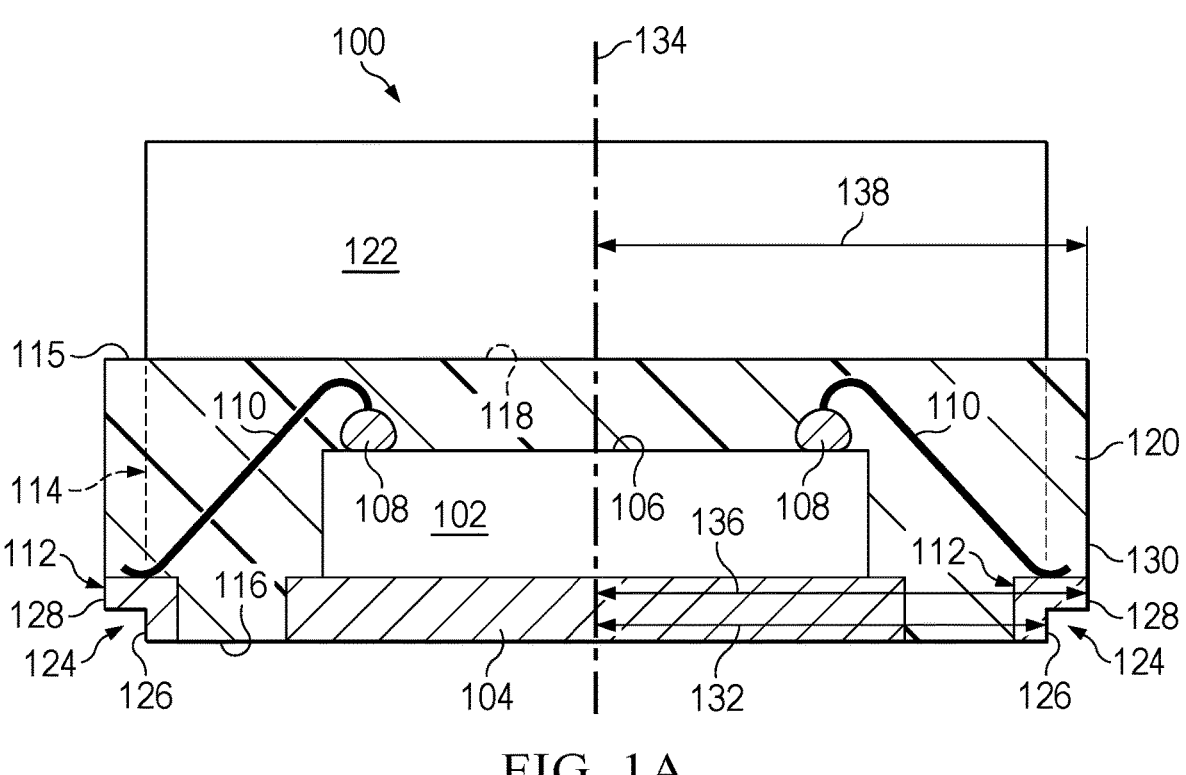
FIG. 1A is a cross-sectional view of a semiconductor package having been manufactured using the singulation technique described herein, in accordance with various examples.

It is generally desirable for semiconductor packages to be as small and efficiently designed as possible. To that end, electrical components (e.g., passive components, such as inductors, capacitors, etc.) that have traditionally been included inside semiconductor packages are frequently relocated to an exterior of the semiconductor package to reduce the size of the semiconductor package or to accommodate other components within the semiconductor package. For example, an inductor that would occupy significant volume within a package may instead be mounted to a top surface of the package and may be electrically coupled to a semiconductor die inside the package using conductive traces (e.g., vias) extending through the mold compound of the package. Such components are typically mounted to exteriors of semiconductor packages after mold compound has been applied to a set of semiconductor dies, but before the mold compound and semiconductor dies have been singulated to form individual packages. Thus, during singulation, the components are already mounted to the exterior surfaces of the semiconductor packages. The singulation process typically entails the use of cutting equipment (e.g., saws) that may strike the components mounted to the exterior surfaces of the packages. Such physical trauma may damage the components. Such damage may also reduce manufacturing yield.

This disclosure describes various examples of a semiconductor package manufacturing technique that mitigates the challenges described above. More specifically, the package manufacturing technique is a singulation technique that may be useful to produce individual semiconductor packages after a mold compound has been applied and after components (e.g., passive components, such as inductors) have been coupled to exterior surfaces of the mold compound. The singulation technique avoids collisions with the components mounted to the exterior surfaces of the mold compound, thereby avoiding damage to the components and significantly boosting manufacturing yield. In examples, the singulation technique includes coupling first and second semiconductor dies to a metal frame and covering the first and second semiconductor dies and the metal frame with a mold compound. The technique also includes coupling first and second passive components to the first and second semiconductor dies, the first and second passive components being on an external surface of the mold compound. The technique further comprises sawing through a portion of the metal frame from a first direction to produce a first vertical surface of the metal frame. The first vertical surface has a first roughness due to the sawing. The technique also comprises laser cutting through the mold compound and a remainder of the metal frame from a second direction opposing the first direction to produce a second vertical surface on the metal frame and a third vertical surface on the mold compound. The second vertical surface has a second roughness due to the laser cutting and the third vertical surface has a third roughness due to the laser cutting.

FIG. 1A is a cross-sectional view of a semiconductor package 100 having been manufactured using the singulation technique described herein, in accordance with various examples. As described below, the semiconductor package 100 includes physical evidence that the package 100 was manufactured using the singulation techniques described herein. The package 100 includes a semiconductor die 102 coupled to a die pad 104. The semiconductor die 102 may be coupled to the die pad 104 by way of a die attach layer, which is not expressly shown. The semiconductor die 102 includes a device side 106 in which circuitry is formed. Ball bonds 108 are coupled to the device side 106, and bond wires 110 couple to conductive terminals 112. A conductive member 114 extends vertically between a bottom surface 116 and a top surface 118 of the package 100. A mold compound 120 covers the semiconductor die 102, die pad 104, ball bonds 108, bond wires 110, conductive terminals 112, and conductive members 114. A passive component 122 (e.g., inductor, capacitor) is coupled to the top surface 118 of the package 100. The conductive member 114 extends through the top surface 118 and has a top surface 115 that couples to a conductive terminal (not expressly shown) of the passive component 122. The conductive member 114 may be coupled to the device side 106 of the semiconductor die 102 through any suitable combination of conductive terminals 112, bond wires 110, metal traces on a printed circuit board (PCB) to which the package 100 may be coupled, etc. FIG. 1A does not expressly show such connections. Additional conductive members 114 may be included.

The package 100 is manufactured using the singulation techniques described herein. The singulation techniques are applied to a structure that includes a lead frame, semiconductor dies on the die pads of the lead frame, a mold compound applied to the dies and the lead frame, and passive components coupled to the mold compound. The singulation techniques result in the formation of multiple, individual semiconductor packages 100. The singulation techniques, as described above, include using a blade saw (e.g., tape saw) to cut part of the way through the lead frame from a first direction. The singulation techniques also include using a laser to cut through the mold compound and the remainder of the lead frame from a second direction that is opposite the first direction. A package manufactured using these singulation techniques will bear physical marks indicating that the singulation techniques were used. Specifically, each conductive terminal 112, which is useful to couple to a PCB or other electrical component, includes a notch 124. The notch 124 is formed because the saw cut, described above, is a relatively wide cut, while the laser cut, also described above, is a relatively narrow cut. Consequently, a vertical surface 126 formed by the saw cut is a horizontal distance 132 from a center 134 of the package 100. In contrast, a vertical surface 128 formed by the laser cut is a horizontal distance 136 from the center 134, and a vertical surface 130 formed by the laser cut is a horizontal distance 138 from the center 134. The horizontal distances 136 and 138 are greater than the horizontal distance 132.

In addition, the vertical surface 126, which is formed by the blade saw cut, has a different roughness than the vertical surface 128, which is formed by a laser cut. Similarly, the vertical surface 126 has a different roughness than the vertical surface 130, which is also formed by a laser cut. Because the vertical surface 128 is composed of metal and vertical surface 130 is composed of mold compound, these surfaces may have differing roughnesses, even though both were revealed using a laser. Each of the vertical surfaces 126, 128, and 130 may have different roughnesses than the roughnesses of other parts of the structure of FIG. 1A, such as other metal components (e.g., die pad 104). Based on real-world measurement data, the vertical surface 126 has a roughness ranging from 4 microns to 8 microns (roughness average (Ra)) due to the saw cut. Based on real-world measurement data, the surface 128 has a roughness ranging from 6 microns to 12 microns (Ra) due to the laser cut. Based on real-world measurement data, the surface 130 has a roughness ranging from 10 microns to 16 microns (Ra) due to the laser cut. A roughness outside of this range appears as physical voiding (i.e., a pitted appearance and structure). The laser cut makes use of ablation/thermal processes where the material (such as mold compound) is being heated by molecular vibrations. This process produces significant amounts of peripheral heating as well as loose debris, recast material and relatively rough edges. This produces missing mold compound fillers which will leave gaps and increase roughness. In contrast, diamond sawing produces a roughness that is dependent on blade grain structure and processing temperature, and the mold compound fillers remain intact after sawing.

In addition to differing distances from the center 134 and different roughnesses, the vertical surfaces 126, 128, and 130 that are cut differently will have different roughness patterns. For example, a blade saw may cause the vertical surface 126 to have a roughness pattern that includes a finer roughness than would be obtained with a laser cut, and that follows the blade grain structure. FIG. 1B shows an example surface having been exposed by a blade saw. In contrast, a laser cut may cause the surfaces 128 and 130 to have a roughness pattern that is rougher than that of a blade cut. For example, a laser used to cut a mold compound may expose a mold compound surface that is missing mold compound fillers as a result of the laser cut, as numeral 140 in FIG. 1C shows.

Figure 1D:
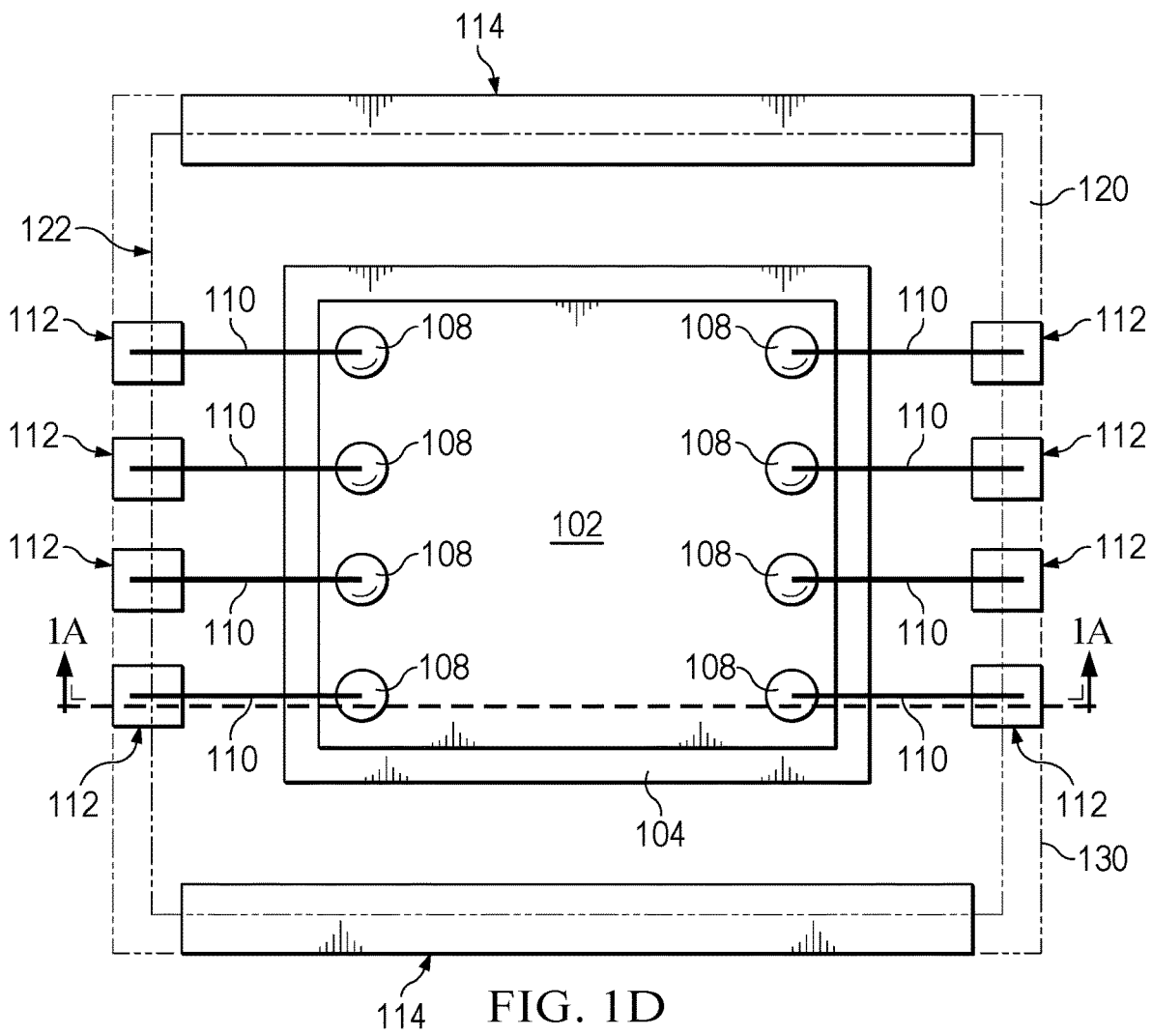
FIG. 1D is a top-down view of a semiconductor package having been manufactured using the singulation technique described herein, in accordance with various examples.
Figure 1E:
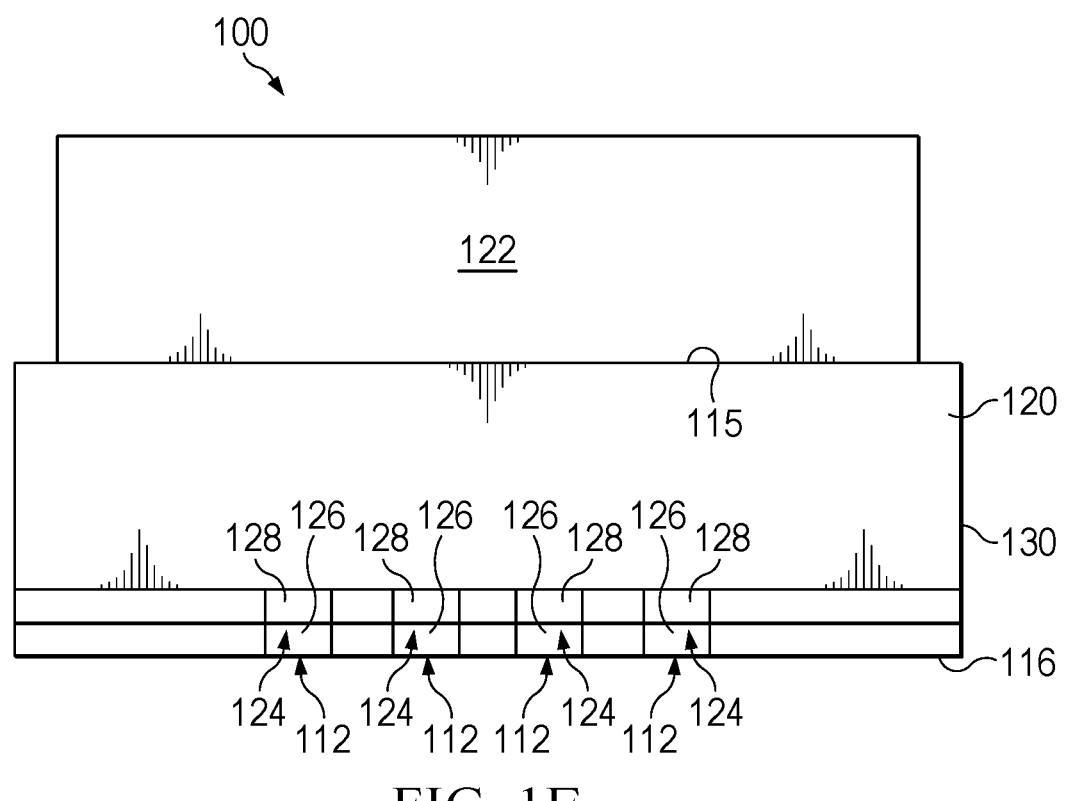
FIG. 1E is a profile view of a semiconductor package having been manufactured using the singulation technique described herein, in accordance with various examples.
Figure 1F:
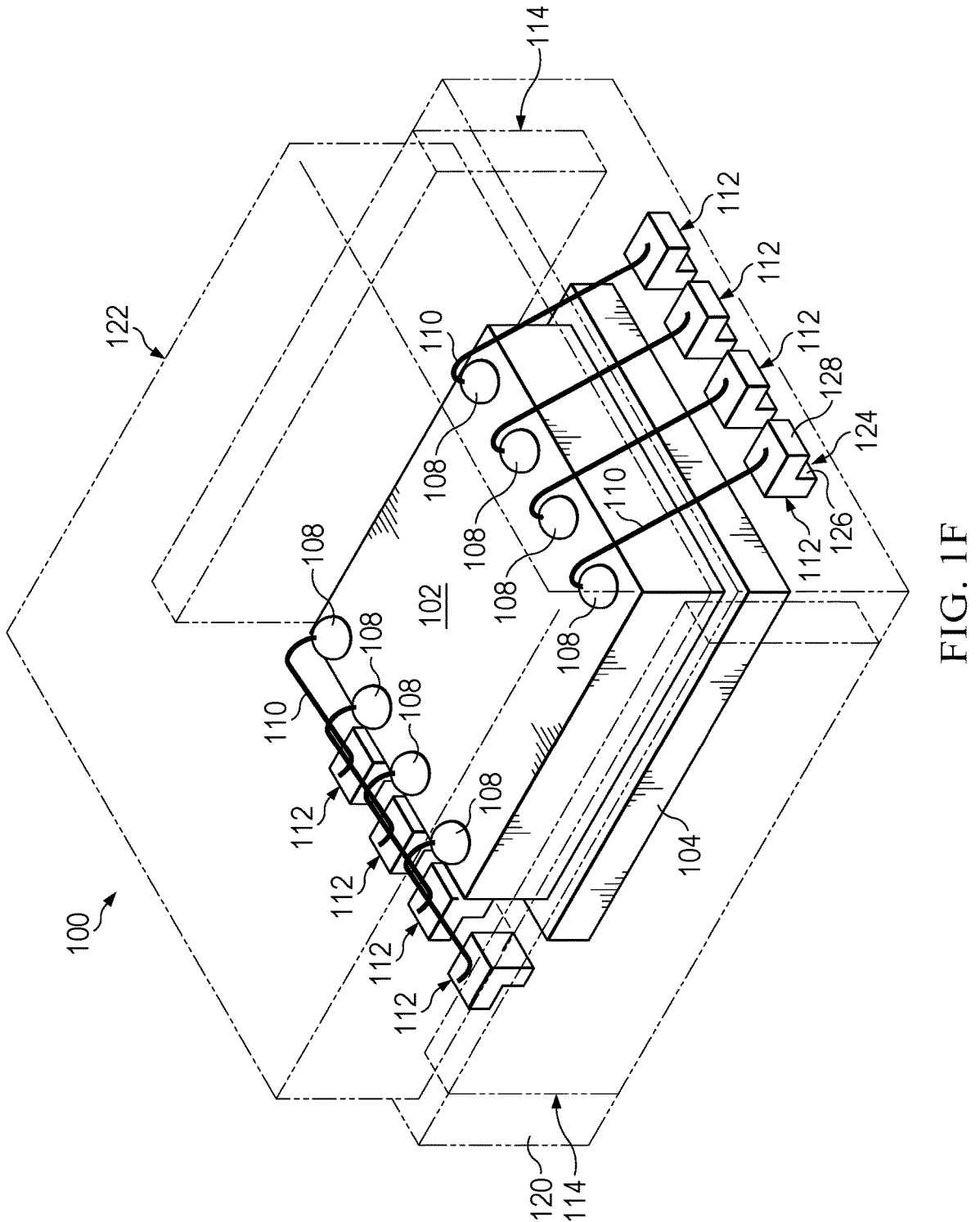
FIG. 1F is a perspective view of a semiconductor package having been manufactured using the singulation technique described herein, in accordance with various examples.

FIG. 1D is a top-down view of the semiconductor package 100, in accordance with various examples. FIG. 1E is a profile view of the semiconductor package 100, in accordance with various examples. FIG. 1F is a perspective view of the semiconductor package 100, in accordance with various examples.

Figure 3A:
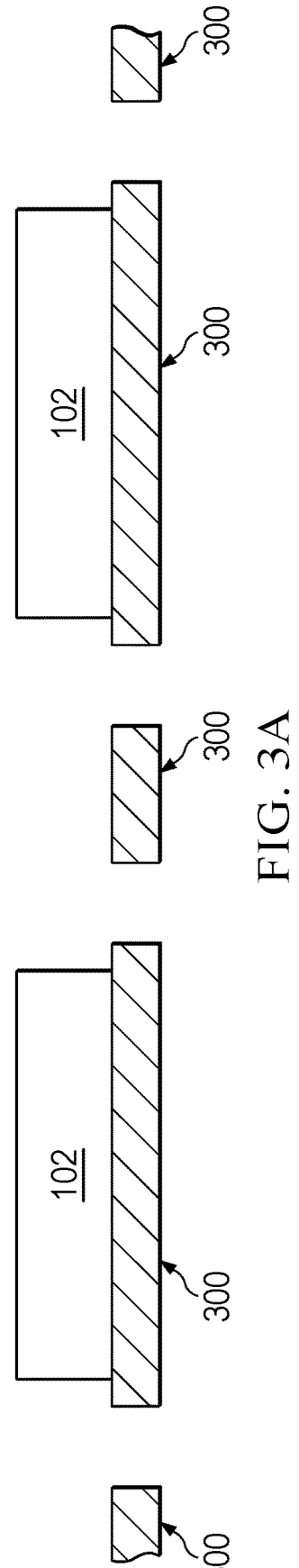
FIG. 3A-3F are a cross-sectional process flow for manufacturing a semiconductor package using the singulation technique described herein, in accordance with various examples.

FIG. 2 is a flow diagram of a method 200 for manufacturing a semiconductor package using the singulation technique described herein, in accordance with various examples. FIG. 3A-3F are a cross-sectional process flow for manufacturing a semiconductor package using the singulation technique described herein, in accordance with various examples. Accordingly, FIGS. 2 and 3A-3F are now described in parallel. The method 200 includes coupling first and second semiconductor dies to a metal frame (202). FIG. 3A shows a cross-sectional view of a lead frame 300 (e.g., a copper lead frame) to which semiconductor dies 102 are coupled. The components of the lead frame 300 shown in FIG. 3A do not appear to be connected to each other, due to the cross-sectional view of FIG. 3A. However, in examples, the components of the lead frame 300 shown in FIG. 3A are coupled to each other. For example, the lead frame 300 may be part of a lead frame tape that was wound on a roll. The semiconductor dies 102 may be coupled to the lead frame 300 using a die attach layer, but to simplify the drawings, such die attach layers are not expressly shown. The lead frame 300 may include the conductive members 114, but the conductive members 114 are not visible in the cross-sectional views of FIGS. 3A-3F.

Figure 3B:
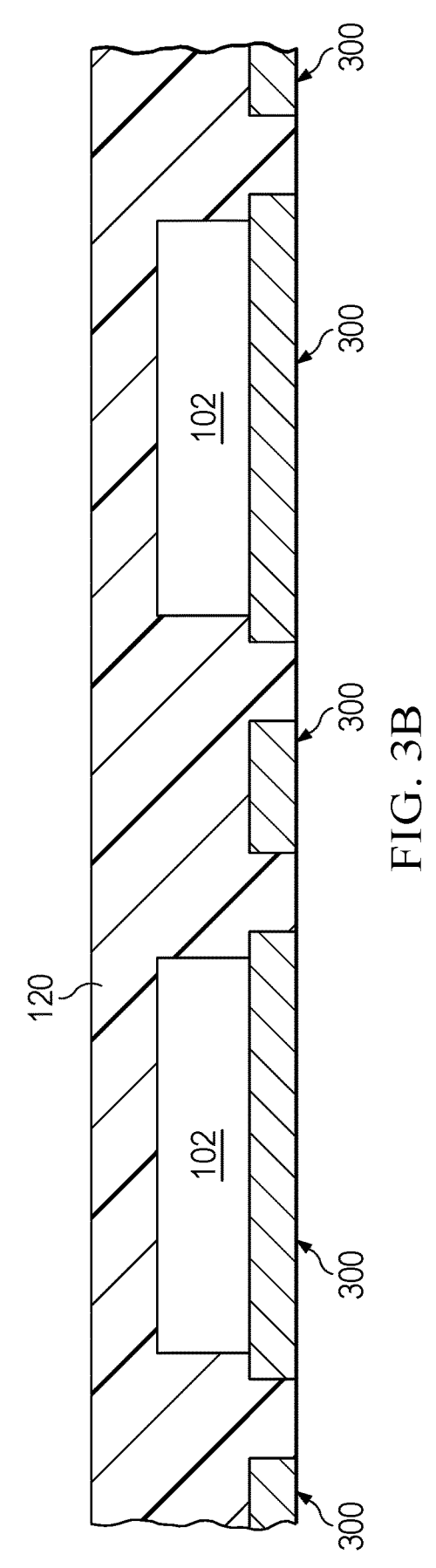

The method 200 includes covering the first and second semiconductor dies and the metal frame with a mold compound (204). FIG. 3B is a cross-sectional view of the structure of FIG. 3A, but with a mold compound 120 applied to cover the lead frame 300 and the semiconductor dies 102. The mold compound may be applied using any suitable technique, such as a mold injection technique (e.g., using a mold chase). In some examples, a mold chase used to apply a mold compound may include structural features that cover the top surfaces 115 of the conductive members 114 to prevent the mold compound from covering these surfaces 115, thereby facilitating the coupling of passive components to these surfaces.

Figure 3C:
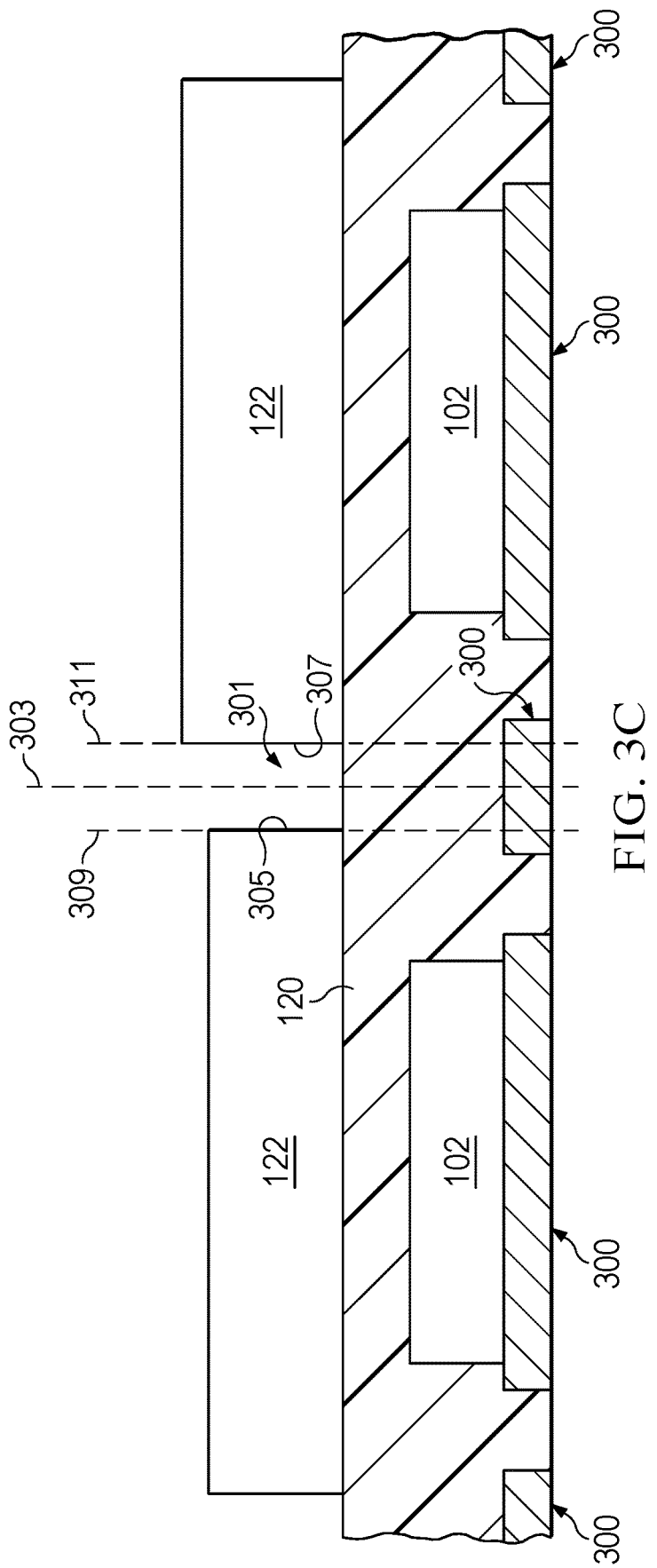

The method 200 may further include coupling the first and second passive components to the first and second semiconductor dies (206). The first and second passive components are coupled to an external surface of the mold compound (206). FIG. 3C is a cross-sectional view of the structure of FIG. 3B, but with the addition of passive components 122. The passive components 122 are coupled to an external surface of the mold compound 120, as shown. The passive components 122 may be coupled to conductive terminals that are exposed to the external surface of the mold compound 120. Such conductive terminals may be electrically coupled to the semiconductor dies 102. For example, the passive components 122 may be coupled (e.g., soldered) to the conductive members 114 of FIG. 1A, and these conductive members 114 may be electrically coupled via one or more conductive structures to the semiconductor dies 102. In examples, the passive components 122 are of different thicknesses.

A gap 301 is between the passive components 122. The gap 301 is vertically aligned with a portion of the lead frame 300, as line 303 indicates. In examples, surfaces 305 and 307 of the passive components 122 face each other across the gap 301, and in such examples, each of the surfaces 305 and 307 is vertically aligned with a same portion of the lead frame 300, as lines 309 and 311 indicate. Such vertical alignments facilitate the formation of the notch 124 (FIG. 1A) during the sawing process, as described below.

Figure 3D:
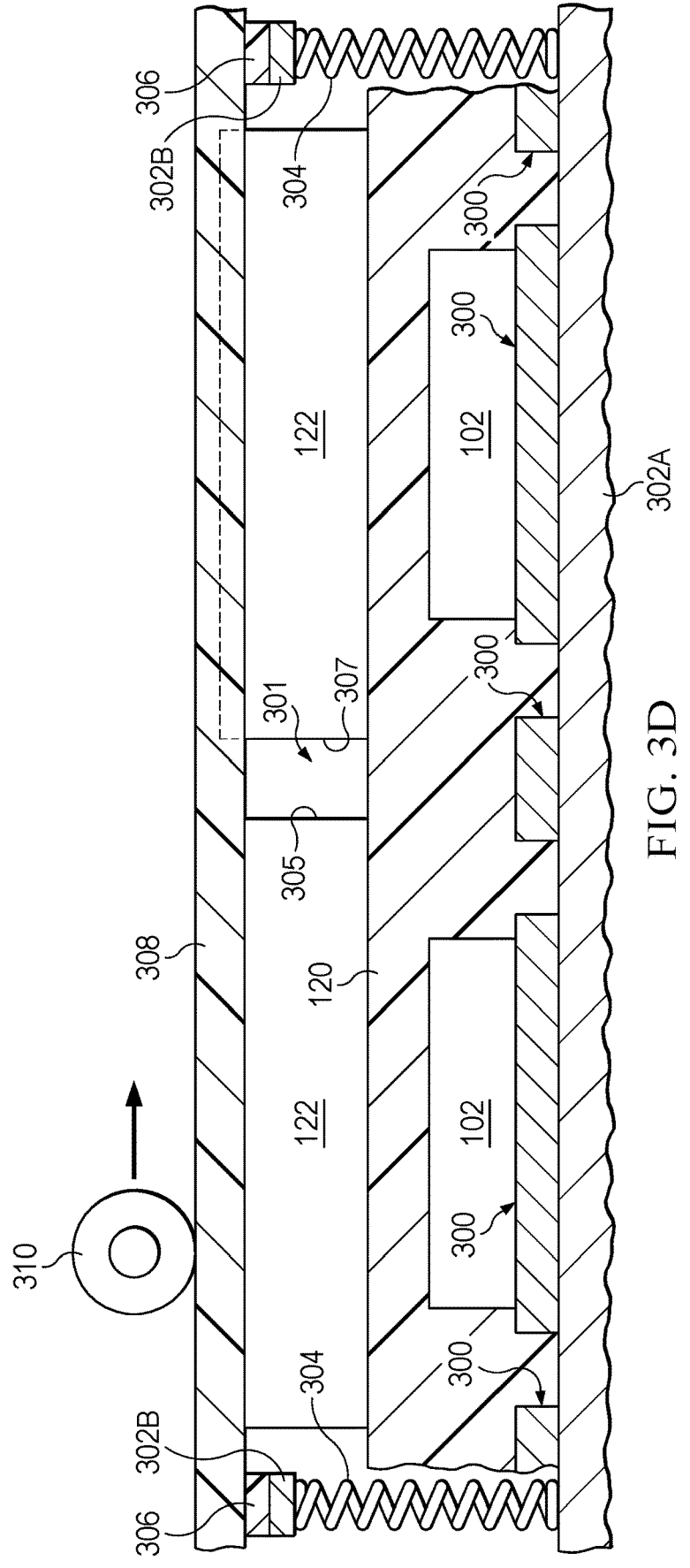

The method 200 further includes applying a tape to the first and second passive components (208). FIG. 3D is a cross-sectional view depicting the structure of FIG. 3C positioned on a chuck table 302A or other suitable platform. The chuck table 302A is coupled to multiple springs 304, and the multiple springs 304 are coupled to chuck members 302B. The springs 304 are useful to adjust a height of the chuck members 302B. The chuck members 302B support a flex frame 306 to which a tape 308 is coupled.

The tape 308 is useful to hold the passive components 122 in place during sawing operations. The tape 308 has features that ensure that it adheres to most or all of the passive components 122, even if the passive components 122 have differing heights, as is the case in FIG. 3D. Specifically, the tape 308 has features that enable it to absorb portions of the passive components 122. Thus, as FIG. 3D shows, although the passive component 122 on the right is thicker than the passive component 122 on the left, the portion of the passive component 122 on the right that exceeds the thickness of the passive component 122 on the left is absorbed by the tape 308, as the dashed line indicates. Critical features of the tape 308 required to facilitate such absorption includes its thickness, which is at least 0.50 millimeters, as well as its base thickness, which is at least 0.30 millimeters and adhesive thickness, which is at least 0.06 millimeters, and its material composition, which includes polyolefin for the base film and acrylic for adhesive. A roller 310, such as a laminate roller, may be useful to adhere the tape 308 to the various passive components 122. Thus, for example, the spring 304 may be useful to adjust the height of the chuck members 302B, thereby adjusting a height of the tape 308, and the roller 310 may be useful in tandem with the height adjustment feature of the spring 304 and chuck members 302B to ensure that the tape 308 adheres to most or all of the passive components 122. In some examples, a latch or other locking mechanism may be useful to maintain a selected height of the chuck members 302B.

Figure 3E:
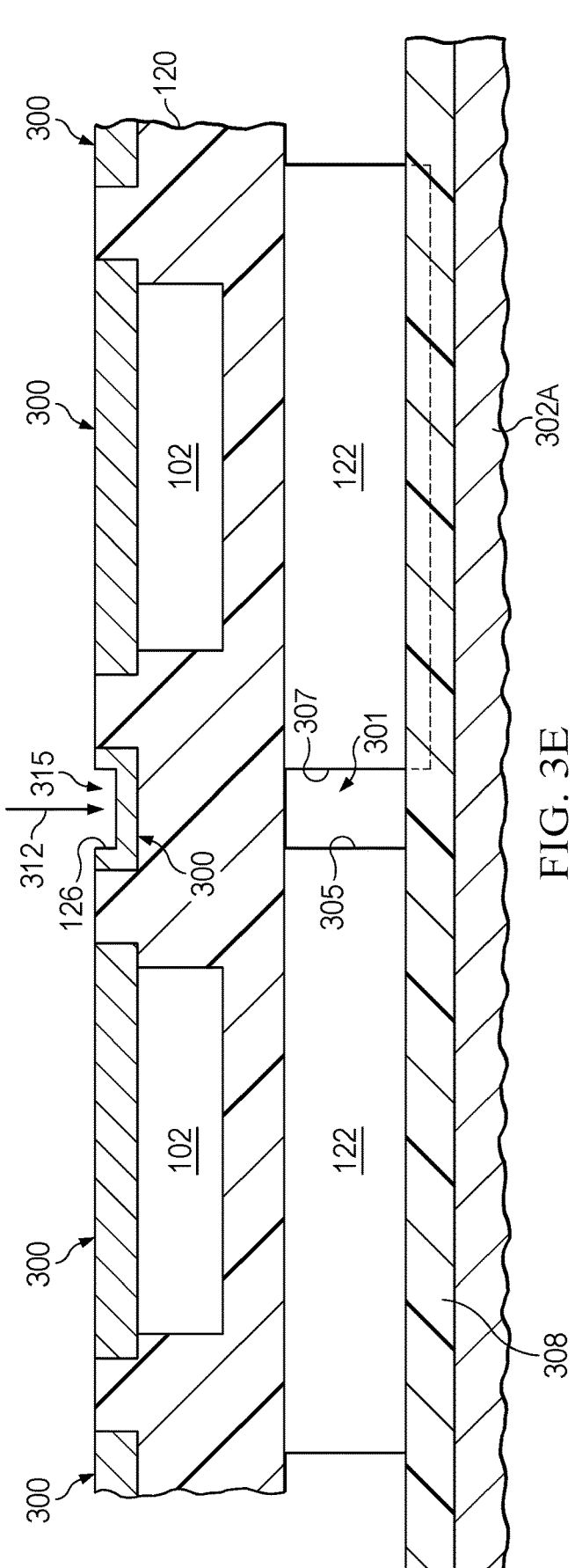

The method 200 includes cutting through a portion of the metal frame from a first direction and using a first cutting technique (210). FIG. 3E is a cross-sectional view of the structure of FIG. 3D, but with the chuck table 302A and chuck members 302B removed, and with the remaining structure turned upside down. Specifically, the tape 308 now lies on the chuck table 302A. In this orientation, the lead frame 300 is accessible for cutting. For example, as FIG. 3E shows, a saw (e.g., a tape saw) may be used to cut through some, but not all, of the thickness of the lead frame 300 segment that is vertically aligned with the gap 301. In examples, the lead frame 300 segment is sawn in the vertical direction 312. In examples, a cut 315 formed along the vertical direction 312 has a width ranging from 0.20 millimeters to 0.40 millimeters. The cut 315 exposes vertical surfaces 126 of the lead frame 300, as shown. In examples, the cut 315 extends halfway through the lead frame 300 segment being cut. In examples, the cut 315 occupies between 45% and 75% of the thickness of the lead frame 300 segment being cut, with a deeper cut 315 being disadvantageous because the lead frame becomes flimsy and easy to break (e.g., when handled in the next process step), and with a shallower cut 315 being disadvantageous because of an excessive thickness that the laser would have difficulty completely cutting, necessitating multiple passes to achieve a complete cut.

Figure 3F:
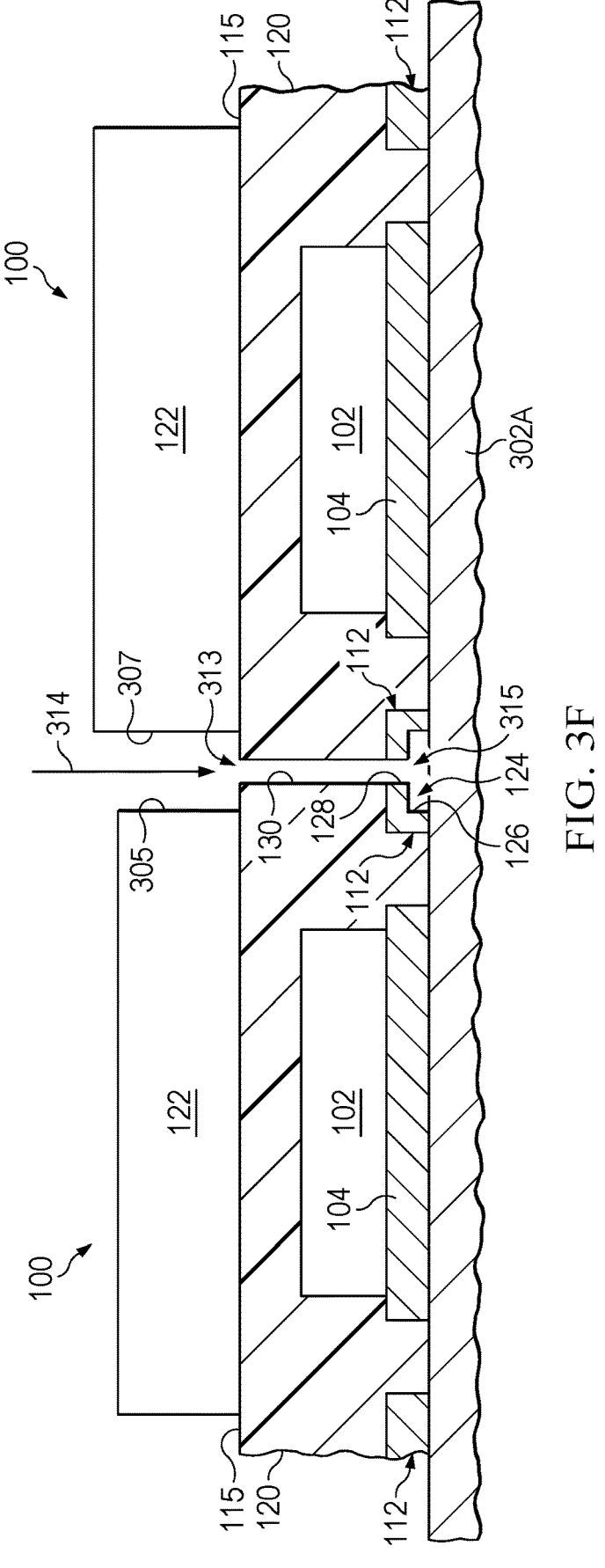

The method 200 includes cutting through the mold compound and a remainder of the metal frame from a second direction and using a second cutting technique (212). The second direction opposes the first direction (212). FIG. 3F is a cross-sectional view of the structure of FIG. 3E, except that the structure is turned upside down such that the mold compound 120 rests on the chuck table 302A and the segment of the mold compound 120 between the passive components 122 is accessible by cutting tools. A laser is used to cut along a vertical direction 314, first through the mold compound 120 and then through a remainder of the thickness of the lead frame 300 segment that contains cut 315. Cut 313 is the result of this cutting operation. The cut of step 212 reveals the surface 130 of the mold compound 120. The cut of step 212 also reveals the surface 128 of the lead frame 300 segment that is being cut. Thus, the lead frame 300 segment being cut includes the vertical surface 126 in the notch 124 and a surface 128, and the mold compound 120 includes a surface 130. The laser used to cut along the vertical direction 314 may have varying average power, effective cutting speed and pulse width, and may have a cut width ranging from 0.05 millimeters to 0.15 millimeters. The notch 124 is formed because the cut width of the saw used to form cut 315 is wider than the cut width of the laser used to form cut 313. Because the cut 313 joins the cut 315, packages 100 (FIGS. 1A and 1D-1F) are formed.

Figure 4A:
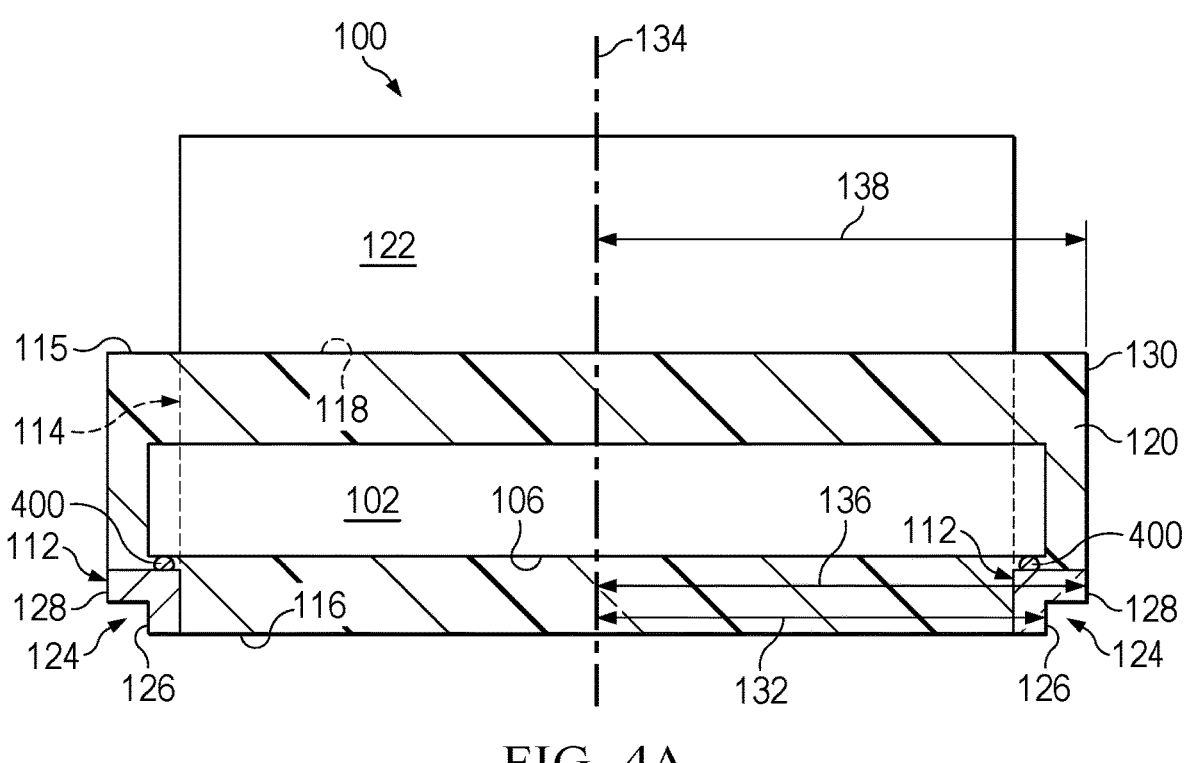
FIG. 4A is a cross-sectional view of a semiconductor package having been manufactured using the singulation technique described herein, in accordance with various examples.
Figure 4B:
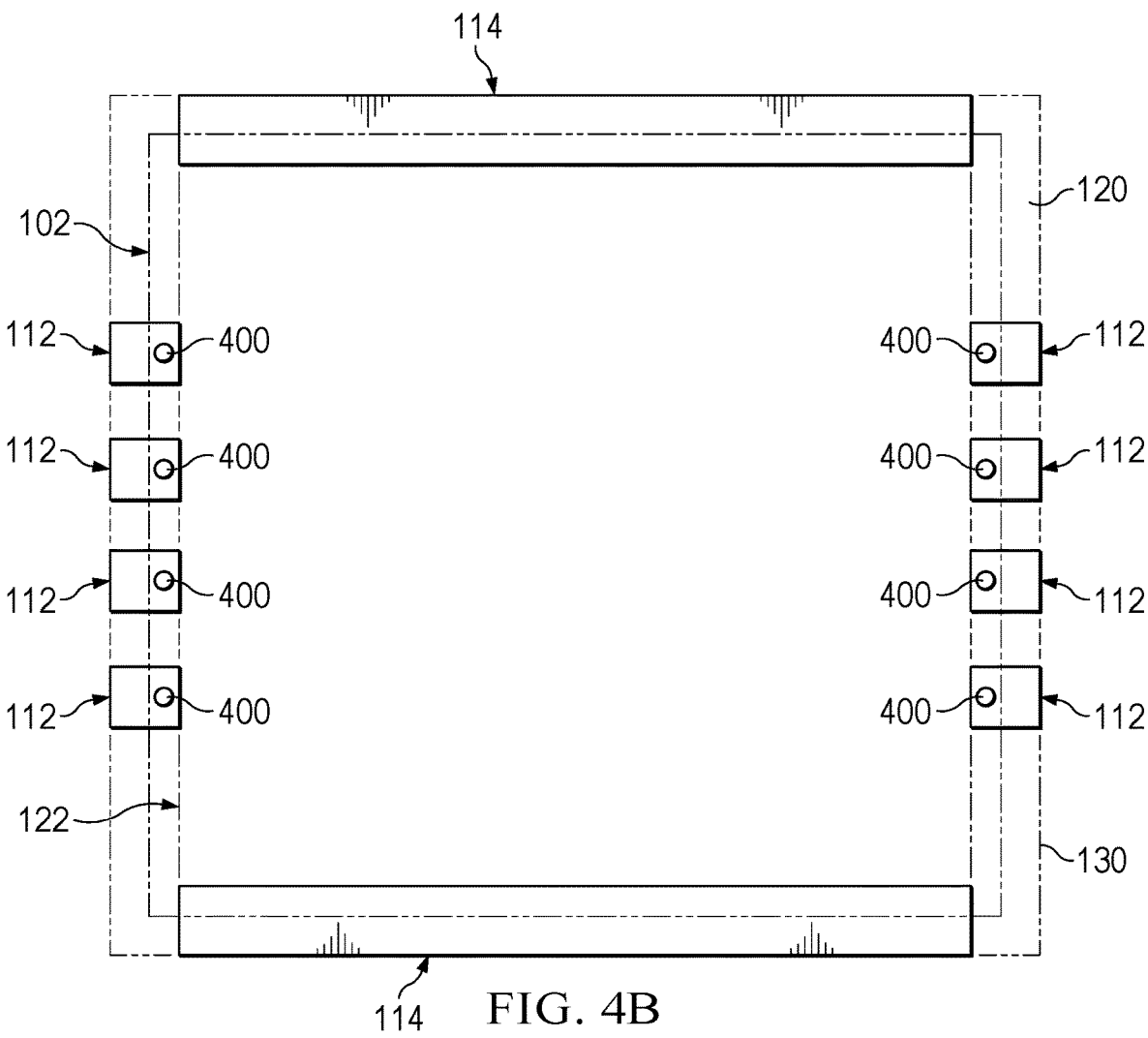
FIG. 4B is a top-down view of a semiconductor package having been manufactured using the singulation technique described herein, in accordance with various examples.
Figure 4C:
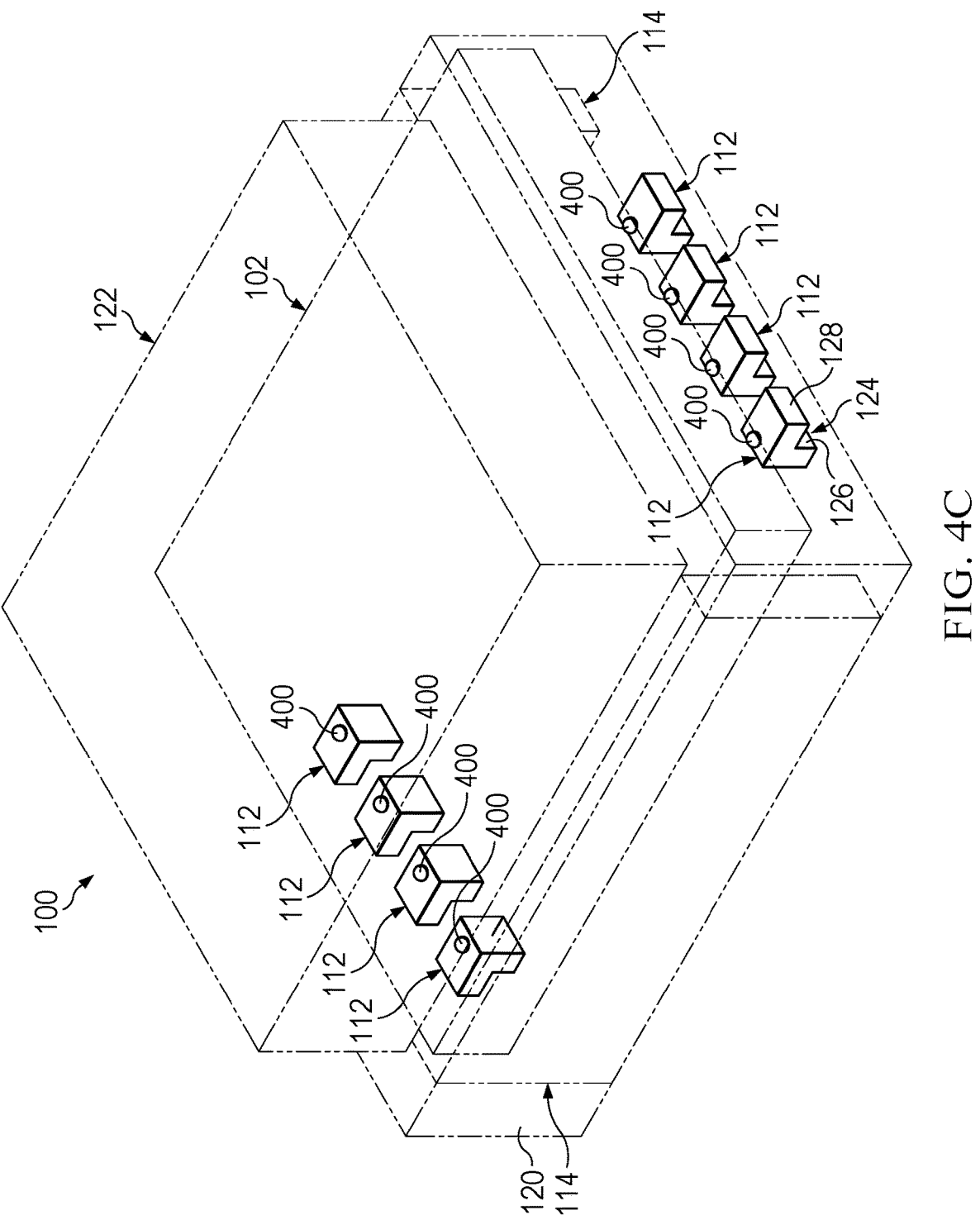
FIG. 4C is a perspective view of a semiconductor package having been manufactured using the singulation technique described herein, in accordance with various examples.

FIG. 4A is a cross-sectional view of a semiconductor package having been manufactured using the singulation technique described herein, in accordance with various examples. The semiconductor package 100 depicted in FIG. 4A is identical to that shown in FIG. 1A, except that the device side 106 of the semiconductor die 100 is facing downward, toward the conductive terminals 112. The device side 106 is coupled to the conductive terminals 112 by way of solder balls 400. Thus, the semiconductor die 100 has a "flip-chip" configuration. FIG. 4B is a top-down view of the semiconductor package 100, in accordance with various examples. FIG. 4C is a perspective view of the semiconductor package 100, in accordance with various examples.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A method for manufacturing a semiconductor package, comprising:

coupling first and second semiconductor dies to a metal frame;

covering the first and second semiconductor dies and the metal frame with a mold compound;

coupling first and second passive components to the first and second semiconductor dies, the first and second passive components on an external surface of the mold compound;

sawing through a portion of the metal frame from a first direction to form a first vertical surface of the metal frame, the first vertical surface having a first roughness due to the sawing; and laser cutting through the mold compound and a remainder of the metal frame from a second direction opposing the first direction to form a second vertical surface on the metal frame and a third vertical surface on the mold compound, the second vertical surface having a second roughness due to the laser cutting and the third vertical surface having a third roughness due to the laser cutting, wherein prior to the sawing and the laser cutting, applying a tape to the first and second passive components, the tape comprising a material composition including polyolefin and acrylic.

2. The method of claim 1, wherein the first roughness ranges from 4 microns to 8 microns roughness average (Ra).

3. The method of claim 1, wherein the second roughness ranges from 6 microns to 12 microns (Ra) and the third roughness ranges from 10 microns to 16 microns (Ra).

4. The method of claim 1, wherein the first and second roughnesses differ from a roughness of a different part of the metal frame.

5. The method of claim 1, wherein the sawing produces a wider cut than the laser cutting, forming a notch in the metal frame as a result.

6. The method of claim 5, wherein the notch is exposed to an exterior of the semiconductor package.

7. The method of claim 1 wherein the tape includes a thickness of at least 0.50 millimeters.

8. A method for manufacturing a semiconductor package, comprising:

coupling first and second semiconductor dies to a metal frame;

covering the first and second semiconductor dies and the metal frame with a mold compound;

coupling first and second passive components to the first and second semiconductor dies, the first and second passive components on an external surface of the mold compound;

applying a tape to the first and second passive components;

sawing through a portion of the metal frame from a first direction; and laser cutting through the mold compound and a remainder of the metal frame from a second direction, the second direction opposing the first direction.

9. The method of claim 8, wherein a first distal end of the first passive component extends farther from the external surface than a second distal end of the second passive component, and further comprising:

using a height-adjustable apparatus to apply the tape to both the first and second distal ends.

10. The method of claim 9, further comprising using a laminate roller along a surface of the tape to apply the tape to the first and second distal ends.

11. The method of claim 8, wherein the sawing includes using a tape saw.

12. The method of claim 8, wherein the metal frame has a first vertical surface, and wherein the sawing produces a first roughness on the first vertical surface.

13. The method of claim 12, wherein the laser cutting produces a second roughness on a second vertical surface of the metal frame, the second roughness greater than the first roughness.

14. The method of claim 13, wherein the laser cutting produces a third roughness on a third vertical surface of the mold compound.

* * * * *